United States Patent
Liu et al.

(10) Patent No.: US 11,417,715 B2
(45) Date of Patent: Aug. 16, 2022

(54) ARRAY SUBSTRATE, DISPLAY SCREEN AND DISPLAY DEVICE

(71) Applicant: KunShan Go-Visionox Opto-Electronics Co., Ltd., Kunshan (CN)

(72) Inventors: Mingxing Liu, Kunshan (CN); Ying Zhao, Kunshan (CN); Bing Han, Kunshan (CN); Shuaiyan Gan, Kunshan (CN); Feng Gao, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 0 days.

(21) Appl. No.: 17/143,416

(22) Filed: Jan. 7, 2021

(65) Prior Publication Data
US 2021/0134909 A1    May 6, 2021

Related U.S. Application Data

(63) Continuation of application No. PCT/CN2019/095041, filed on Jul. 8, 2019.

(30) Foreign Application Priority Data

Jan. 31, 2019   (CN) .......................... 201910097327.8

(51) Int. Cl.
*H01L 27/32* (2006.01)
*G09G 3/3233* (2016.01)
*H01L 51/52* (2006.01)

(52) U.S. Cl.
CPC ....... *H01L 27/3251* (2013.01); *G09G 3/3233* (2013.01); *H01L 27/3218* (2013.01);
(Continued)

(58) Field of Classification Search
CPC ............ G06K 9/0004; G06V 40/1318; G09G 2360/14; G09G 2360/142;
(Continued)

(56) References Cited

U.S. PATENT DOCUMENTS 10,644,077 B1 * 5/2020 Choi ................. H01L 29/78648
2004/0150352 A1 * 8/2004 Koide .................. G09G 3/3258
315/169.3

(Continued)

FOREIGN PATENT DOCUMENTS

CN          102351435 A     2/2012
CN          104576690 A     4/2015
(Continued)

OTHER PUBLICATIONS

Office Action and Search Report dated May 18, 2020 in corresponding Chinese application No. 201910097327.8; 14 pages including Machine-generated English-language translation.
(Continued)

*Primary Examiner* — Yuzhen Shen
(74) *Attorney, Agent, or Firm* — Maier & Maier, PLLC

(57) ABSTRACT

An array substrate, a display screen and a display device. The array substrate includes a base substrate, a non-transparent first OLED substrate, and a transparent second OLED substrate. The first OLED substrate at least partially surrounds the second OLED substrate. The second OLED substrate includes a first electrode layer located on the base substrate, a light emitting structure layer located on the first electrode layer, and a second electrode layer located on the light emitting structure layer. The first electrode layer includes a plurality of first electrodes. The light emitting structure layer includes a plurality of light emitting structures. A number of the first electrodes is less than a number
(Continued)

of the light emitting structures. Each of the first electrodes corresponds to one of the light emitting structures.

17 Claims, 6 Drawing Sheets

(52) U.S. Cl.
CPC ...... *H01L 27/3234* (2013.01); *H01L 51/5206* (2013.01); *H01L 51/5234* (2013.01); *G09G 2300/0452* (2013.01); *H01L 2251/301* (2013.01); *H01L 2251/308* (2013.01)

(58) Field of Classification Search
CPC .......... G09G 2360/148; H01L 27/3234; H01L 27/3227; H01L 27/3216; H01L 27/3218; H01L 27/3211; H01L 27/3223
See application file for complete search history.

(56) References Cited

U.S. PATENT DOCUMENTS

| | | | |
|---|---|---|---|
| 2010/0309233 A1* | 12/2010 | Choi | H01L 27/3262 345/77 |
| 2015/0102302 A1 | 4/2015 | Kim et al. | |
| 2018/0269397 A1* | 9/2018 | Xin | H01L 51/001 |
| 2019/0206953 A1* | 7/2019 | Hsieh | H01L 51/5234 |
| 2020/0083489 A1* | 3/2020 | Fang | H01L 21/77 |
| 2021/0376004 A1 | 12/2021 | Li et al. | |

FOREIGN PATENT DOCUMENTS

| | | | |
|---|---|---|---|
| CN | 106921767 | A | 7/2017 |
| CN | 107622749 | A | 1/2018 |
| CN | 107819018 | A | 3/2018 |
| CN | 107994054 | A | 5/2018 |
| CN | 108257514 | A | 7/2018 |
| CN | 108364967 | A | 8/2018 |
| CN | 108428729 | A | 8/2018 |
| CN | 108598115 | A | 9/2018 |
| CN | 109285860 | A | 1/2019 |

OTHER PUBLICATIONS

Office Action dated Aug. 11, 2020 in corresponding Chinese application No. 201910097327.8; 9 pages.
Office Action and Search Report dated Sep. 22, 2020 in corresponding Chinese application No. 201910097327.8; 15 pages including Machine-generated English-language translation.
International Search Report dated Sep. 20, 2019 in corresponding International application No. PCT/CN2019/095041; 4 pages.
Written Opinion of the International Searching Authority dated Sep. 20, 2019 in corresponding International application No. PCT/CN2019/095041; 6 pages.
Extended European Search Report dated May 12, 2022 in corresponding European Application No. 19913316.6; 10 pages.
Office Action dated May 17, 2022, in connection with corresponding Japanese Application No. 2021-521211 (8 pp. including machine-generated English translation).

\* cited by examiner

ARRAY SUBSTRATE, DISPLAY SCREEN AND DISPLAY DEVICE

CROSS REFERENCE TO RELATED APPLICATIONS

This disclosure is a continuation application of International Patent Application No. PCT/CN2019/095041, filed on Jul. 8, 2019, which claims priority to Chinese Patent Application No. 201910097327.8 filed on Jan. 31, 2019, the contents of which is incorporated herein by reference.

FIELD

The present application relates to the field of display, and in particular, to an array substrate, a display screen and a display device.

BACKGROUND

With the rapid development of display terminals, users have higher and higher requirements on a screen-to-body ratio, so that full-screen displaying of the display terminals has received more and more attention from display field. For a display terminal such as a mobile phone and a tablet computer, because a front camera, an earphone, an infrared sensing element, etc. need to be integrated therein, a notch may be disposed on a display screen of the display terminal to receive the front camera, the earphone, the infrared sensing element, etc. However, the notched area on the display screen like a notch screen cannot be used to display pictures. Or, the camera may be disposed by drilling a hole on a screen. However, with respect to an electronic device that realizes a camera function, external lights may enter a photosensitive element located below a screen through the hole on the screen, causing poor imaging effects. As such, the display screens of these display terminals are not full screens.

SUMMARY

Based on this, the present application provides an array substrate, a display screen and a display device.

The present application provides an array substrate, including a base substrate, a first OLED (Organic Light Emitting Diode) substrate, and a transparent second OLED substrate. The first OLED substrate is a non-transparent OLED substrate. The first OLED substrate at least partially surrounds the second OLED substrate, and the second OLED substrate includes a first electrode layer located on the base substrate, a light emitting structure layer located on the first electrode layer, and a second electrode layer located on the light emitting structure layer. The first electrode layer includes a plurality of first electrodes. The light emitting structure layer includes a plurality of light emitting structures. A number of the first electrodes is less than a number of the light emitting structures. Each of the first electrodes corresponds to one of the light emitting structures.

The number of the first electrodes is less than the number of the light emitting structures, and each of the first electrodes corresponds to one of the light emitting structures. That is to say, first electrodes below a part of the light emitting structures are omitted to reduce a pixel density of the transparent second OLED substrate, thereby improving increasing its transparency and remaining a structure of the light emitting structure layer unchanged. That is to say, mask openings in different areas in the mask are uniformly distributed, and stresses at boundaries of the different areas are also uniform. Under the premise that the transparent second OLED substrate has sufficient light transparency, there will be no wrinkles formed at the boundaries of the different areas in the mask, avoiding the risk of color mixing at boundaries of the transparent second OLED substrate and other display areas.

The present application further provides a display screen, including an array substrate as described above, and an encapsulating layer for encapsulating the array substrate.

The present application further provides a display device, including a device body, and a display screen as described above. The device body has a component area. The display screen covers the device body. The component area is located below a second OLED substrate. A photosensitive element that collects lights through the second OLED substrate is disposed in the component area.

DETAILED DESCRIPTION

Figure 1:
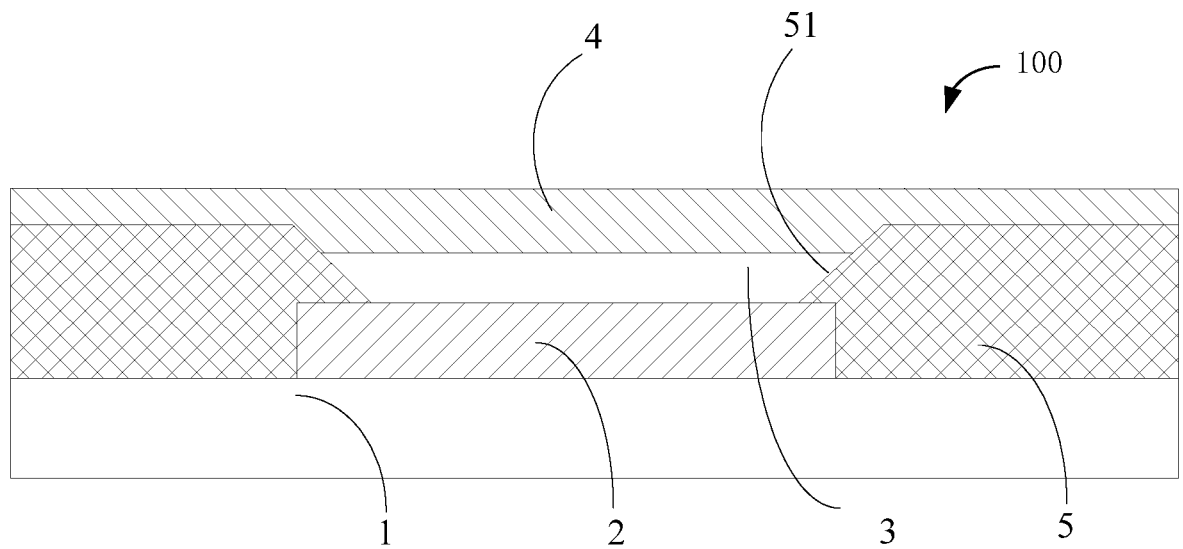
FIG. 1 is a schematic cross-sectional view illustrating a transparent OLED substrate according to an example of the present application.

Examples will be described in detail herein, with the illustrations thereof represented in the drawings. When the following descriptions involve the drawings, like numerals in different drawings refer to same or similar elements unless otherwise indicated. The embodiments described in the following examples do not represent all embodiments consistent with the present disclosure. Rather, they are merely examples of apparatuses consistent with some aspects of the present disclosure as detailed in the appended claims.

The above-mentioned display terminal or electronic device cannot display images in a camera area. Moreover, a light transparency of the display terminal is not high. In this case, in order to improve the light transparency, a display area in a substrate corresponding to a photosensitive element is set as a transparent display area with a lower pixel density according to the present application and a pixel density of a normal display area other than the transparent display area remains unchanged. Further, the pixel density may be lowered by reducing the number of light emitting structures in the transparent display area, and the number of light emitting structures in the normal display area remains unchanged. However, in contrast, if the same precise mask is used to fabricate the light emitting structures in the normal display area and the transparent display area, openings in a first area in the mask corresponding to the normal display area are denser, while openings in a second area in the mask corresponding to the transparent display area are sparse, which easily leads to uneven stresses at boundaries of the first area and the second area in the mask, and further to wrinkles formed at the boundaries of the first area and the second area in the mask, thereby causing a risk of color mixing between the normal display area and the transparent display area of the substrate.

Figure 9:
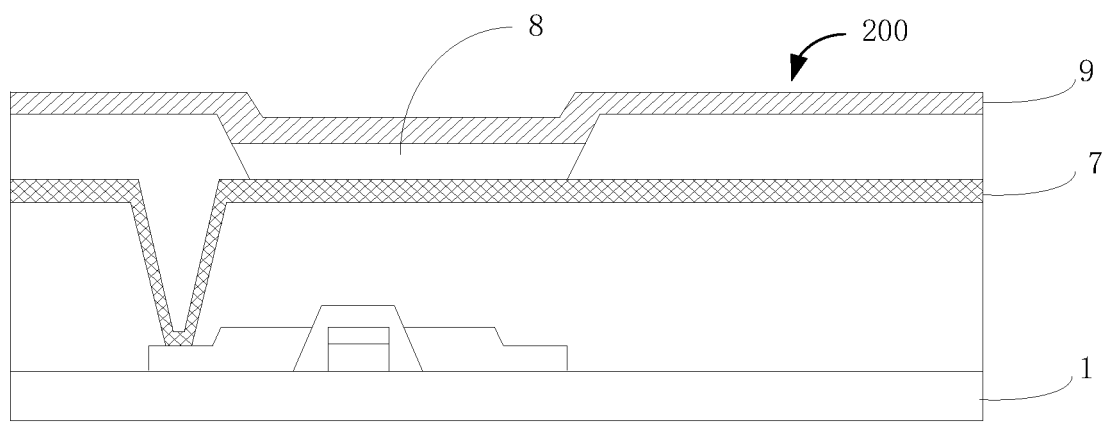
FIG. 9 is a schematic cross-sectional view illustrating a first OLED substrate of an array substrate according to an example of the present application.
Figure 11:
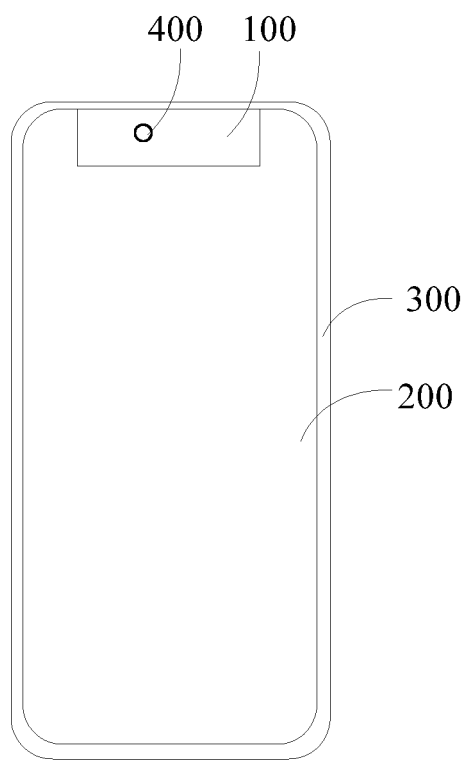
FIG. 11 is a schematic structural diagram illustrating a display device according to an example of the present application.

In order to solve the above technical problems, as shown in FIGS. 1, 9 and 11, in an example, an array substrate is provided, comprising a base substrate 1, a first OLED substrate 200, and a second OLED substrate 100. The first OLED substrate 200 is a non-transparent OLED substrate, and at least partially surrounds the second OLED substrate 100. The second OLED substrate 100 includes a first electrode layer 2 located on the base substrate, a light emitting structure layer 3 located on the first electrode layer 2, and a second electrode layer 4 located on the light emitting structure layer 3. The first electrode layer 2 includes a plurality of first electrodes. The light emitting structure layer 3 includes a plurality of light emitting structures. The number of the first electrodes is less than the number of the light emitting structures. Each of the first electrodes corresponds to one of the light emitting structures.

The number of the first electrodes is less than the number of the light emitting structures, and each of the first electrodes corresponds to one of the light emitting structures. That means, first electrodes below a certain part of the light emitting structures are omitted, and thus pixel circuits below the certain part of the light emitting structures are omitted, thereby causing the certain part of the light emitting structures not to emit light. A pixel density of the transparent OLED substrate is reduced, i.e., a pixel density of the second OLED substrate 100 is reduced to increase a light transparency thereof, so that a structure of the light emitting structure layer may remain unchanged (relative to other non-transparent display areas). In this way, openings in different areas of a mask are uniformly distributed, and stresses at boundaries of the different areas are also uniform. Under the premise that the transparent OLED substrate has a sufficient light transparency, there will be no risk of color mixing at boundaries of the transparent OLED substrate and other display areas (the first OLED substrate as described above) due to wrinkles formed in a mask.

FIG. 1 is a schematic structural diagram illustrating a transparent OLED substrate 100 (i.e., a second OLED substrate) in an example. Referring to FIG. 1, the transparent OLED substrate 100 includes a first electrode layer 2 located on a base substrate 1, a light emitting structure layer 3 located on the first electrode layer 2, and a second electrode layer 4 located on the light emitting structure layer 3. The transparent OLED substrate 100 further includes a pixel definition layer 5. The first electrode layer 2 is formed on the base substrate 1. The pixel definition layer 5 is formed on the first electrode layer 2. The pixel definition layer 5 has a plurality of pixel openings 51. The light emitting structure layer 3 is located on the first electrode layer 2 and is disposed in the pixel openings 51. The second electrode layer 4 is formed on the light emitting structure layer 3. The first electrode layer 2 may be an anode layer. Correspondingly, the second electrode layer 4 is a cathode layer. Optionally, the first electrode layer may be a cathode layer, and the second electrode layer is correspondingly an anode layer.

In an example, the base substrate 1 may be a rigid substrate such as a glass substrate, a quartz substrate, a plastic substrate or other transparent substrates. In another example, the base substrate 1 may be a flexible substrate such as a flexible PI substrate.

In an example, in order to improve the light transparency of the transparent OLED substrate, materials of conductive wires of the transparent OLED substrate such as the first electrode layer 2 and the second electrode layer 4 may include transparent materials. Light transparency of the first electrode layer and the second electrode layer are greater than 40%, preferably greater than 60%, and more preferably not less than 80%. For example, materials of the first electrode layer 2 and the second electrode layer 4 may include a transparent conductive metal oxide or a mixture of magnesium and silver. For example, the materials of the first electrode layer 2 and the second electrode layer 4 may include at least one of indium tin oxide (ITO), indium zinc oxide (IZO), silver-doped ITO, or silver-doped IZO.

In an example, the second electrode layer 4 is a planar electrode. Optionally, the second electrode layer 4 has a single layer structure or a stack structure. When the second electrode layer 4 has the single layer structure, the second electrode layer 4 is a single metal layer or a single metal mixture layer or a single transparent metal oxide layer. When the second electrode layer 4 has the stack structure, the second electrode layer 4 includes a transparent metal oxide layer stacked with a metal layer, or a transparent metal oxide layer stacked with a metal mixture layer.

When materials of the second electrode layer 4 are doped with a metal and a thickness of the second electrode layer 4 is greater than or equal to 100 angstroms and less than or equal to 500 angstroms, the second electrode layer 4 is an integral and continuous planar electrode, and has a transparency greater than 40%. When the materials of the second electrode layer 4 are doped with a metal and the thickness of the second electrode layer 4 is greater than or equal to 100 angstroms and less than or equal to 200 angstroms, the second electrode layer 4 is an integral and continuous planar electrode and has a transparency greater than 40%. When the materials of the second electrode layer 4 are doped with a metal and the thickness of the second electrode layer 4 is greater than or equal to 50 angstroms and less than or equal to 200 angstroms, the second electrode layer 4 is an integral and continuous planar electrode and has a transparency greater than 50%. When the materials of the second electrode layer 4 are doped with a metal and the thickness of the second electrode layer 4 is greater than or equal to 50 angstroms and less than or equal to 200 angstroms, the second electrode layer 4 is an integral and continuous planar electrode and has a transparency greater than 60%. When the second electrode layer 4 has a single layer structure, materials of the single metal layer include Al or Ag, materials of the single metal mixture layer include MgAg or a Al-doped metal mixture, and materials of the transparent metal oxide layer is ITO or IZO.

The first electrode layer 2 includes a plurality of first electrodes 20, as shown in FIGS. 3 to 8. A drive circuit of a first electrode 20 is a 2T1C drive circuit, including 2 thin film transistors (TFTs) and 1 capacitor, and a data line provides a data voltage signal for the first electrode. Compared with a 7T1C (7 TFTs and 1 capacitor) drive circuit of an OLED substrate, the 2T1C drive circuit is simpler, reducing the complexity of the drive circuit and facilitating to further improve the light transparency of the transparent OLED substrate.

Figure 2:
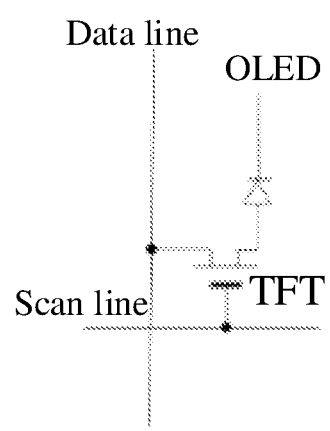
FIG. 2 is a schematic diagram illustrating a drive circuit of a first electrode of a transparent OLED substrate according to an example of the present application.

Optionally, the drive circuit of the first electrode includes 1 TFT. Referring to FIG. 2, the transparent OLED substrate includes a scan line Scan and a data line Data. The data line Data is electrically connected to a source of the TFT. The first electrode (indicated by OLED in FIG. 2) is electrically connected to a drain of the TFT. The scan line Scan is electrically connected to a gate of the TFT. The scan line Scan is used to control the drive circuit to turn on and off. The data line Data, when the drive circuit is turned on, provides a drive current signal for the first electrode to control the light emitting structure layer to emit light. The number of switch devices in the drive circuit is reduced to two or one, which greatly reduces load currents of the scan line and the data line, on the basis of simplifying the complexity of a panel structure and reducing diffraction caused by a gap of the panel structure, to reduce requirements for resistances of materials of conductive wires such as an anode, a cathode, scan lines and data lines. In this way, the conductive wires such as the anode, the cathode, scan lines, data lines and the like may be made of a transparent material so as to improve the light transparency of the display panel while ensuring the performance of the panel. In another example, the data line Data is electrically connected to the drain of the TFT, the first electrode (indicated by OLED in FIG. 2) is electrically connected to the source of the TFT, and the scan line Scan is electrically connected to the gate of the TFT.

Figure 3:
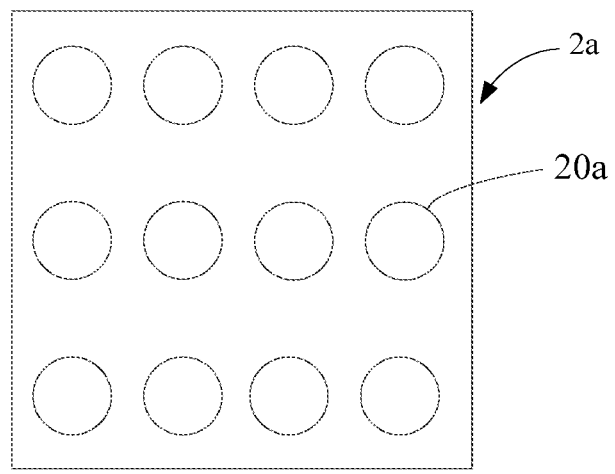
FIG. 3 is a schematic top view illustrating a first electrode layer of a transparent OLED substrate according to an example of the present application.
Figure 4:
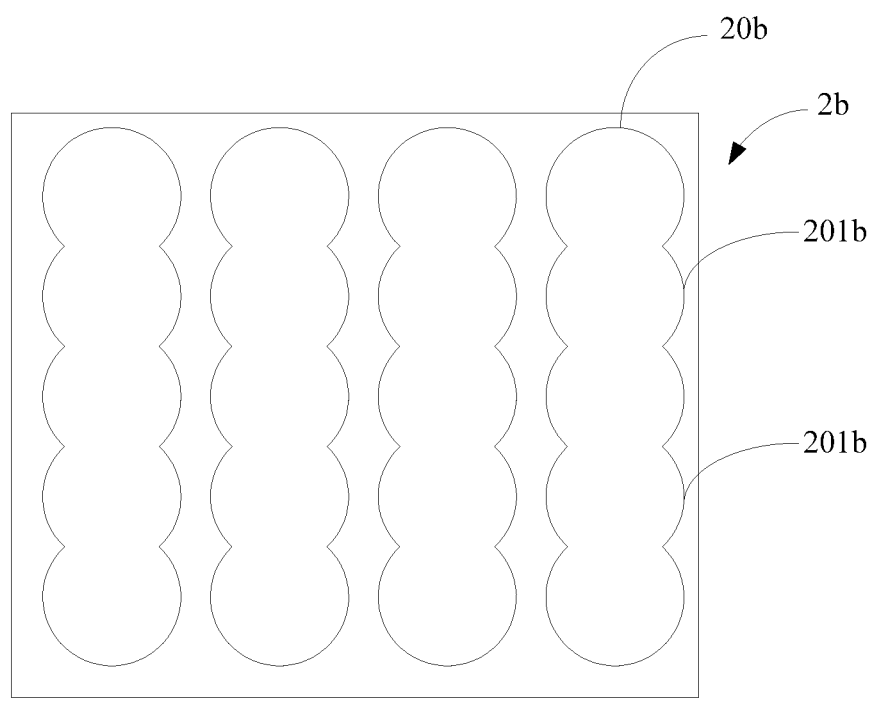
FIG. 4 is a schematic top view illustrating a first electrode layer of a transparent OLED substrate according to another example of the present application.

Referring to FIGS. 3 and 4, a first electrode 20a of a first electrode layer 2a is circular or gourd-shaped, but the first electrode 20a may also have other shapes such as a square, an oval, a dumbbell shape or a wave shape. The first electrode 20a shown in FIG. 3 is circular. In some examples, the square may include a right-angled square or a rounded square. In an example, the first electrodes 20a in the same row or column correspond to light emitting structures of a same color, and the first electrodes 20a in the same row or column receive the same data signal. One data signal may drive the entire row or column of the first electrodes 20a, thereby simplifying the structure of the drive circuit. The first electrodes 20a in the same row or column may be connected via connecting lines (not shown). The connecting lines may be routed through other film layers or non-display areas.

A first electrode 20b of the first electrode layer 2b shown in FIG. 4 is gourd-shaped, and extends along a first direction. The first direction is a row or column direction of the transparent OLED substrate (the row direction is a scan line direction, and the column direction is a data line direction). In FIG. 4, the first direction is a column direction of the array substrate. In this example, the first electrode 20b is formed by sequentially connecting a plurality of first sub-electrodes 201b in the same column, and each of the first sub-electrodes 201b corresponds to one light emitting structure. The first electrode 20b is connected to the same data line through one drive circuit, thereby reducing the number of the drive circuit and simplifying the structure of the drive circuit. In this example, the second electrode layer 4 is a planar electrode.

Figure 5:
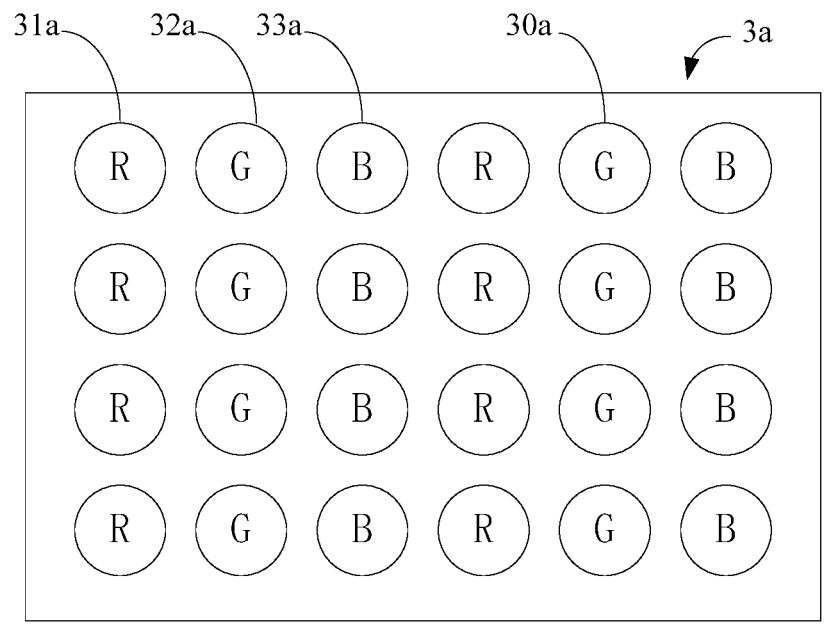
FIG. 5 is a schematic top view illustrating a light emitting structure layer of a transparent OLED substrate according to an example of the present application.
Figure 6:
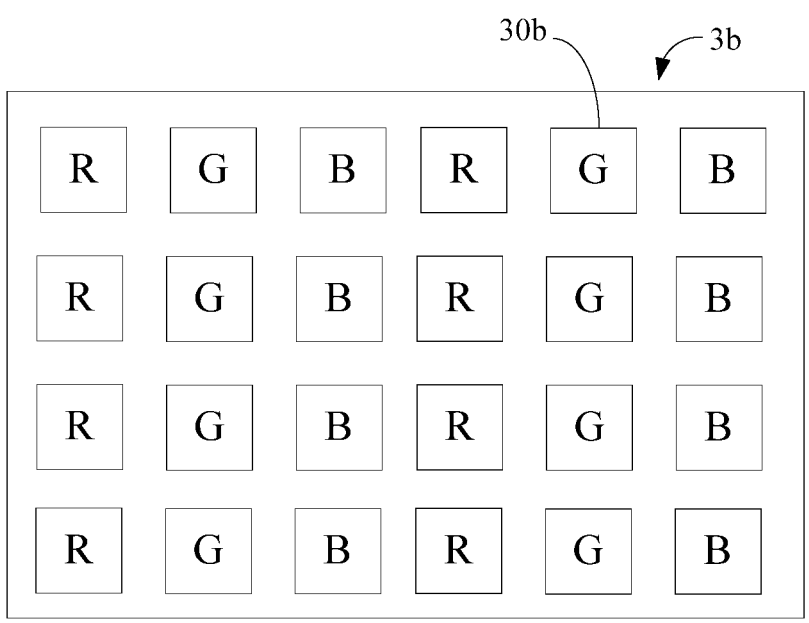
FIG. 6 is a schematic top view illustrating a light emitting structure layer of a transparent OLED substrate according to another example of the present application.

Referring to FIG. 5, a light emitting structure layer 3a includes a plurality of light emitting structures 30a. The light emitting structures 30a shown in FIG. 5 are circular. The light emitting structure layer 3a includes light emitting structures of n colors. If n is equal to 3, the light emitting structure layer 3a includes a red first light emitting structure 31a, a green second light emitting structure 32a, and a blue third light emitting structure 33a. Light emitting structures 30b shown in FIG. 6 are square. In other examples, the light emitting structure has an oval shape, a dumbbell shape or the like. In some examples, the light emitting structures in the same row or column are of the same color, as shown in FIGS. 5 and 6.

Figure 7:
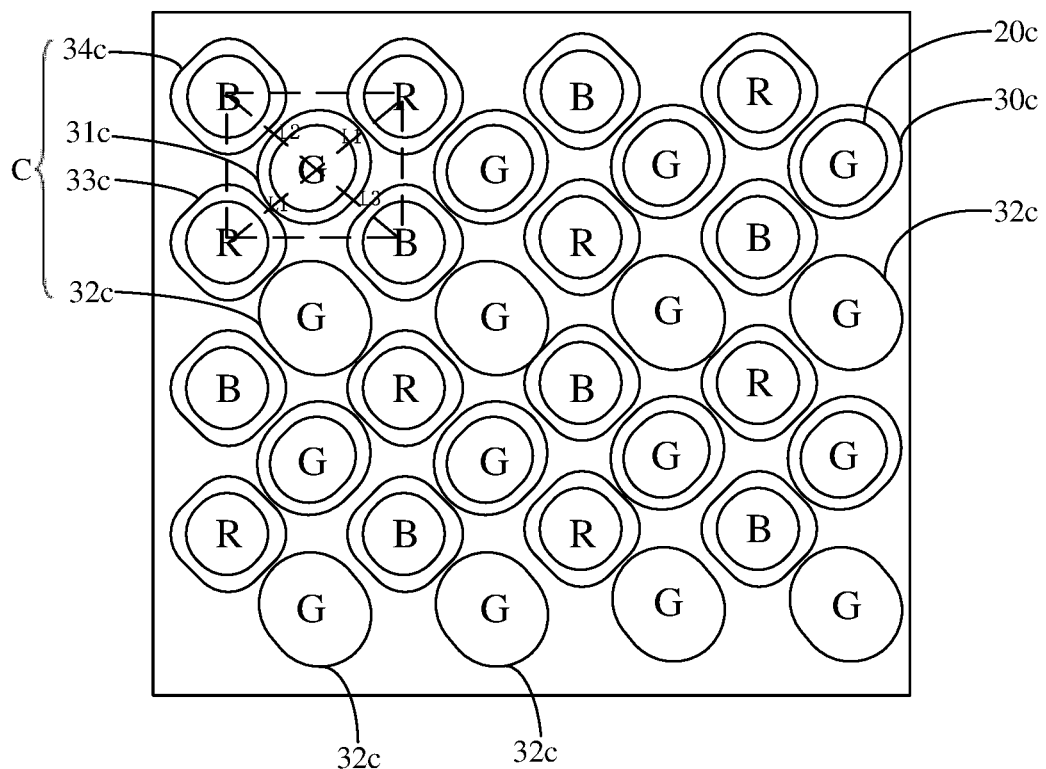
FIG. 7 is a schematic top view illustrating a first electrode layer and a light emitting structure layer of a transparent OLED substrate according an example of to the present application.

FIG. 7 is a schematic top view illustrating a first electrode layer and a light emitting structure layer of a transparent OLED substrate according to an example of the present application. The first electrode layer includes a plurality of first electrodes 20c. The first electrodes 20c have a rounded square shape. The light emitting structure layer includes a plurality of light emitting structures. The light emitting structures also have a rounded square shape. The number of the first electrodes 20c is less than the number of the light emitting structures 30c. Each of the first electrodes 20c corresponds to one light emitting structure 30c. Due to that the number of the light emitting structures 30c is larger in comparison, the first electrodes 20c are not disposed below a part of the light emitting structures and the area corresponding to the part of the light emitting structures has a higher light transparency. When the transparent OLED substrate is working, the part of the light emitting structures does not emit light.

With continued reference to FIG. 7, the light emitting structure layer includes a plurality of pixel units C arranged in an array. Each of the pixel units C includes light emitting structures of three colors, i.e., green, red and blue, in which at least two light emitting structures of the same color are included. In the at least two light emitting structures of the same color, the first electrodes 20c are disposed below a part of the light emitting structures while the first electrodes 20c are not disposed below the other part of the light emitting structures, which improves the light transparency of the transparent OLED substrate without affecting the normal display effect of the transparent OLED substrate. As shown in FIG. 7, each of the pixel units C includes a first light emitting structure 31c, a second light emitting structure 32c, a third light emitting structure 33c and a fourth light emitting structure 34c corresponding to four colors, green, green, red and blue in sequence (R, G and B represent only colors of the light emitting structures, and letters in the drawing are marked only on overlapping areas of the first electrodes and the light emitting structures). That is, each of the pixel units C includes light emitting structures of three colors. The first electrode 20c is not disposed below the green second light emitting structure 32c. That is, one of the two green light emitting structures in one pixel unit C emits light, and the other does not emit light, which improves the light transparency of the transparent OLED substrate without affecting the normal display effect of the transparent OLED substrate. In other examples, alternatively, the first electrode 20c is not disposed below a light emitting structure of another color. For example, the first electrode 20c is not disposed below a blue second light emitting structure, or the first electrode 20c is not disposed below a red second light emitting structure.

In FIG. 7, in the column direction as the first direction, the first light emitting structures 31c and the second light emitting structures 32c which actually do not emit light, are arranged alternately to ensure that the transparent OLED substrate displays uniformly in the first direction. For example, the first light emitting structures 31c and the second light emitting structures 32c which actually do not emit light in the same column are arranged alternately. In the entire light emitting structure layer, since the pixel units are arranged in an array, the second light emitting structures 32c which actually do not emit light in the plurality of pixel units C are correspondingly arranged in an array, facilitating to improve the overall display uniformity of the transparent OLED substrate.

Referring to FIG. 7, a pixel arrangement of the OLED display device includes a plurality of pixels. The third, fourth and first light emitting structures 33c, 34c, 31c could be regarded as a first, second and third pixels 33c, 34c, 31c. The plurality of pixels comprises a pair of first pixels 33c, ex., pixels R, and a pair of second pixels 34c, ex., pixels B, disposed at four vertexes of a virtual quadrilateral. The plurality of pixels further includes the third pixel 31c, ex., pixel G, disposed in the virtual quadrilateral.

Specifically, the pair of first pixels 33c are disposed at opposite sides of the third pixel 31c along a second virtual diagonal line of the virtual quadrilateral, and spaced from the third pixel at a substantially same distance, L1. The pair of second pixels 34c are disposed at opposite sides of the third pixel along a first virtual diagonal line of the virtual quadrilateral crossing the first virtual diagonal line. According to FIG. 7, the pair of second pixels 34c are spaced from the third pixel 31c at different distances, i.e., L2 is unequal to L3, to make the pair of second pixels 34c not symmetrically arranged with respect to the third pixel 31c. A center of the third pixel 31c is deviated from a center of the virtual quadrilateral.

Figure 8:
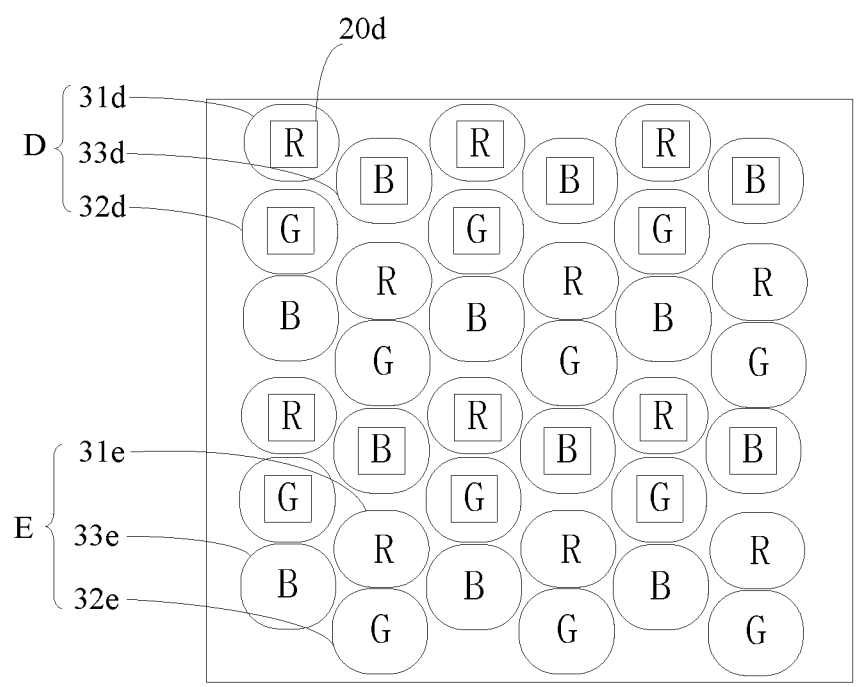
FIG. 8 is a schematic top view illustrating a first electrode layer and a light emitting structure layer of a transparent OLED substrate according to another example of the present application.

Referring to FIG. 8, in another example, the light emitting structure layer includes a plurality of first pixel units D and second pixel units E arranged in an array. Each of the first pixel units D includes light emitting structures of n colors. In this example, n is equal to 3, the three colors are red, green and blue. Each of the first pixel units D includes a red light emitting structure 31d, a green light emitting structure 32d, and a blue light emitting structure 33d. Each of the red light emitting structure 31d, the green light emitting structure 32d and the blue light emitting structure 33d corresponds to one first electrode 20d. Each of second pixel units E includes light emitting structures of n colors. In this example, n is equal to 3, and the light emitting structures of n colors are, for example, red, green and blue light emitting structures. Each of the second pixel units includes a red light emitting structure 31e, a green light emitting structure 32e, and a blue light emitting structure 33e. The first electrodes 20d are not disposed below the red light emitting structure 31e, the green light emitting structure 32e, and the blue light emitting structure 33e. That is, after the transparent OLED substrate is powered on, the first pixel units D emit light, and the second pixel units E do not emit light, which improve the light transparency of the transparent OLED substrate without affecting the display effect of the transparent OLED substrate.

In FIG. 8, in the column direction as the first direction, the first pixel units D and the second pixel units E which actually do not emit light are alternately arranged to ensure that the transparent OLED substrate displays uniformly in the first direction. In the entire light emitting structure layer, the second pixel units E are arranged in an array, facilitating to improve the overall display uniformity of the transparent OLED substrate.

The array substrate provided by the present application includes the first OLED substrate 200 as shown in FIG. 9, and the second OLED substrate 100 as shown in FIG. 1. The first OLED substrate 200 at least partially surrounds the second OLED substrate 100, as described in FIG. 11. The area corresponding to the first OLED substrate 200 on the array substrate may be rectangular or circular. The area corresponding to the second OLED substrate 100 on the array substrate may be circular, rectangular, drop-shaped, bang-shaped, etc. The second OLED substrate is the transparent OLED substrate 100 described in any of the previous examples.

Referring to FIG. 9, the first OLED substrate 200 includes a third electrode layer 7 formed on the base substrate 1, a light emitting material layer 8 formed on the third electrode layer 7, and a fourth electrode layer 9 formed on the light emitting material layer 8. The third electrode layer 7 includes a plurality of third electrodes. The light emitting material layer 8 includes a plurality of light emitting materials. The third electrodes correspond to the light emitting materials one to one. In an example, the light emitting material layer 8 of the first OLED substrate and the light emitting structure layer 3 of the second OLED substrate are formed by the same mask during the same process. The adjacent light emitting structures of the light emitting structure layer 3 and the adjacent light emitting materials of the light emitting material layer 8 may have the same sizes and the equal spacing. The area in the mask corresponding to the first OLED substrate and the area in the mask corresponding to the second OLED substrate may be provided with mask openings of the same size. Since opening sizes and opening spacing are equal, stresses at the boundary of the two areas are uniform, avoiding wrinkles formed at the boundary of the first OLED substrate and the second OLED substrate. At the same time, the first electrodes are not disposed below a part of the light emitting structures included in the light emitting structure layer 3 of the second OLED substrate, ensuring that the second OLED substrate has a sufficiently large light transparency under the premise of normal display.

Figure 10:
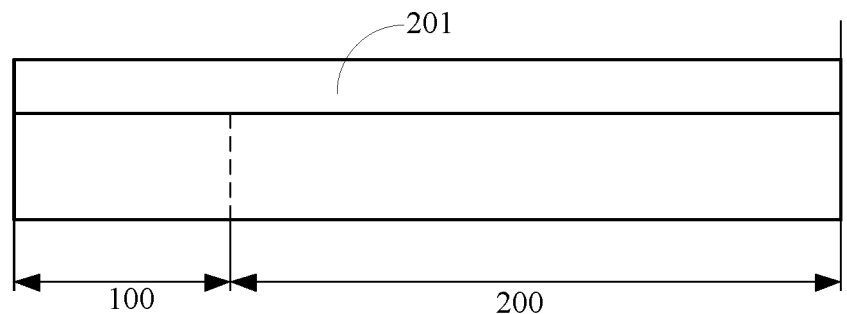
FIG. 10 is a schematic structural diagram illustrating a display screen according to an example of the present application.

The present application further provides a display screen, as shown in FIG. 10, comprising the array substrate as described above, and an encapsulating layer 201 for encapsulating the array substrate. An area corresponding to the first OLED substrate 200 is a non-transparent display area. An area corresponding to the second OLED substrate 100 is a transparent display area. Optionally, the transparent display area corresponds to a PMOLED screen, and the non-transparent display area corresponds to an AMOLED (Active Matric Organic Light Emitting Diode) screen. Photosensitive elements such as a camera and a sensor may be disposed below the PMOLED (Passive Matric Organic Light Emitting Diode) screen. The photosensitive elements may collect external lights through the transparent PMOLED screen. The display screen ensures the performance of the photosensitive elements while achieving a display function.

Referring to FIG. 11, the present application further provides a display device. The display device includes a device body 300, and a display screen covering the device body. The display device may be a mobile phone, a tablet computer, a notebook computer or other devices. Taking the mobile phone as an example, the device body may include elements such as a house, a circuit board, a battery and a processor. The device body 300 also has a component area.

The component area is located below the second OLED substrate 100, and a photosensitive element 400 that collects lights through the second OLED substrate 100 is disposed in the component area. The photosensitive element 400 may be a camera, an infrared sensor or other optical sensors. Due to the high light transparency of the second OLED substrate 100, it is ensured that the photosensitive element collects sufficient light.

The above descriptions are only preferred examples of the present application, and are not intended to limit the application. Any modification, equivalent replacement, improvement, etc. made within the spirit and principle of this application shall be contained within the protection scope of the application.

The invention claimed is:

1. An array substrate, comprising
a base substrate;
a non-transparent first OLED (Organic Light Emitting Diode) substrate; and
a transparent second OLED substrate, the second OLED substrate comprising a first electrode layer located on the base substrate, a light emitting structure layer located on the first electrode layer; and a second electrode layer located on the light emitting structure layer,
wherein the first OLED substrate at least partially surrounds the transparent second OLED substrate; and
wherein the first electrode layer comprises a plurality of first electrodes, the light emitting structure layer comprises a plurality of light emitting structures, a number of the first electrodes is less than a number of the light emitting structures, and each of the first electrodes corresponds to one of the light emitting structures,
wherein the number of the first electrodes is less than the number of the light emitting structures such that a part of the light emitting structures does not emit light to reduce a pixel density of the transparent second OLED substrate, thereby increasing a transparency and remaining a structure of the light emitting structure layer unchanged,
wherein the light emitting structure layer comprises a plurality of first light emitting structures and second light emitting structures of a same color, the first light emitting structures correspond to the first electrodes one to one, and the first electrodes are not disposed below the second light emitting structures,
wherein the light emitting structure layer comprises a plurality of pixel units, and each of the pixel units comprises the first light emitting structure and the second light emitting structure;
the first light emitting structures and the second light emitting structures are alternately arranged in a first direction which is a row direction or a column direction of the array substrate,
wherein:
each of the pixel units further comprises a pair of first pixels and a pair of second pixels disposed at four vertexes of a virtual quadrilateral, and a third pixel disposed in the virtual quadrilateral; and
the third pixels of the pixel units are alternately arranged in the first direction of the array substrate as the first light emitting structures and the second light emitting structures.

2. The array substrate according to claim 1, wherein the light emitting structure layer comprises a plurality of first pixel units and a plurality of second pixel units, each of the first pixel units and each of the second pixel units comprise the light emitting structures of n colors respectively, n is a natural number, each of the light emitting structures in the first pixel units corresponds to one of the first electrodes, and the first electrodes are not disposed below each of the light emitting structures in the second pixel units.

3. The array substrate according to claim 2, wherein the first pixel units and the second pixel units are alternately arranged in a first direction which is a row direction or a column direction of the array substrate.

4. The array substrate according to claim 2, wherein the second pixel units are arranged in an array.

5. The array substrate according to claim 2, wherein:
each of the plurality of first pixel units and the plurality of second pixel units comprises a first pixel, a second pixel and a third pixel;
the first pixel, the second pixel and the third pixel of the first pixel units have the first light emitting structures; and
the first pixel, the second pixel and the third pixel of the second pixel units have the second light emitting structures.

6. The array substrate according to claim 1, wherein the second light emitting structures are arranged in an array.

7. The array substrate according to claim 1, wherein a drive circuit of the first electrodes comprises one thin film transistor, the second OLED substrate comprises a data line which is electrically connected to a source or a drain of the thin film transistor, the first electrodes are electrically connected to the drain or the source of the thin film transistor, and the data line provides a drive current for the first electrodes to control the light emitting structure layer to emit light when the drive circuit of the first electrode is turned on.

8. The array substrate according to claim 1, wherein the light emitting structures corresponding to the first electrodes in the same row or in the same column are of a same color, and the first electrodes in the same row or column receive a same data signal.

9. The array substrate according to claim 1, wherein the first OLED substrate comprises a third electrode layer, a light emitting material layer formed on the third electrode layer, and a fourth electrode layer formed on the light emitting material layer,
the third electrode layer comprises a plurality of third electrodes, the light emitting material layer comprises a plurality of light emitting material portions, and
the third electrodes correspond to the light emitting material portions one to one.

10. The array substrate according to claim 9, wherein the light emitting material layer of the first OLED substrate and the light emitting structure layer of the second OLED substrate are formed by a same mask during a same process,
both an area in the mask corresponding to the first OLED substrate and an area in the mask corresponding to the second OLED substrate are provided with mask openings of a same size,
adjacent light emitting structures in the light emitting structure layer and adjacent light emitting material portions in the light emitting material layer have a same size and an equal spacing.

11. The array substrate according to claim 1, wherein the first electrode layer and the second electrode layer have a light transparency greater than 40%, and materials of the first electrode layer and the second electrode layer comprise a transparent conductive metal oxide or a mixture of magnesium and silver.

12. The array substrate according to claim 1, wherein the second electrode layer is a planar electrode, and the second electrode layer has a single layer structure or a stack structure;
  when the second electrode layer has the single layer structure, the second electrode layer is a single metal layer or a single metal mixture layer or a single transparent metal oxide layer,
  when the second electrode layer has the stack structure, the second electrode layer is a stack in which a transparent metal oxide layer and a metal layer are laminated, or a stack in which a transparent metal oxide layer and a metal mixture layer are laminated;
  when a material of the second electrode layer is doped with a metal and a thickness of the second electrode layer is greater than or equal to 100 angstroms and less than or equal to 500 angstroms, the second electrode layer is an integral and continuous planar electrode and has a transparency greater than 40%;
  when the material of the second electrode layer is doped with the metal and the thickness of the second electrode layer is greater than or equal to 100 angstroms and less than or equal to 200 angstroms, the second electrode layer is an integral and continuous planar electrode and has a transparency greater than 40%;
  when the material of the second electrode layer is doped with the metal and the thickness of the second electrode layer is greater than or equal to 50 angstroms and less than or equal to 200 angstroms, the second electrode layer is an integral and continuous planar electrode and has a transparency greater than 50%;
  when the second electrode layer has the single layer structure, a material of the single metal layer comprises Al or Ag, a material of the single metal mixture layer comprises Mg, Ag or a metal mixture doped with Al, and the transparent metal oxide is indium tin oxide or indium zinc oxide.

13. A display device, comprising
a device body having a component area; and
  a display screen including an array substrate according to claim 1 covering the device body, and an encapsulating layer for encapsulating the array substrate,
  wherein the component area is located below a second OLED substrate, and a photosensitive element that collects lights through the second OLED substrate is disposed in the component area.

14. The array substrate according to claim 1, wherein the pair of the second pixels are disposed at opposite sides of the third pixel along a first virtual diagonal line of the virtual quadrilateral, and spaced from the third pixel at different distances, to make the second pixels not symmetrically arranged with respect to the third pixel.

15. A pixel arrangement of an OLED (Organic Light Emitting Diode) display device, comprising:
  a plurality of pixels comprising:
  a pair of first pixels and a pair of second pixels disposed at four vertexes of a virtual quadrilateral, and a third pixel disposed in the virtual quadrilateral,
  the pair of the second pixels are disposed at opposite sides of the third pixel along a first virtual diagonal line of the virtual quadrilateral, and spaced from the third pixel at different distances, to make the second pixels not symmetrically arranged with respect to the third pixel,
  wherein a number of electrodes is less than a number of the plurality of pixels such that a part of the plurality of pixels does not emit light, thereby increasing a transparency and remaining a structure of the plurality of pixels unchanged.

16. The pixel arrangement according to claim 15, wherein the pair of the first pixels are disposed at opposite sides of the third pixel along a second virtual diagonal line of the virtual quadrilateral, and spaced from the third pixel at a substantially same distance.

17. The pixel arrangement according to claim 16, wherein a first pixel is a pixel R emitting red light, a second pixel is a pixel B emitting blue light, and the third pixel is a pixel G emitting green light.

* * * * *